United States Patent
Cox et al.

(10) Patent No.: US 7,486,507 B2
(45) Date of Patent: Feb. 3, 2009

(54) SERVER CONTROL PANEL SYSTEM

(75) Inventors: Aaron R. Cox, Tucson, AZ (US); John C. Hilburn, Austin, TX (US); Brad M. Johnson, Raleigh, NC (US); Tristan A. Merino, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 11/619,292

(22) Filed: Jan. 3, 2007

(65) Prior Publication Data

US 2008/0158831 A1 Jul. 3, 2008

(51) Int. Cl.
*G06F 1/16* (2006.01)
(52) U.S. Cl. ...................................... 361/683
(58) Field of Classification Search ................ 361/683, 361/686, 727; 174/72 A
See application file for complete search history.

(56) References Cited

U.S. PATENT DOCUMENTS

| 5,801,921 | A  | * | 9/1998  | Miller        | 361/686 |
| 6,301,095 | B1 | * | 10/2001 | Laughlin et al.| 361/624 |
| 6,471,170 | B2 | * | 10/2002 | Pook          | 248/215 |

* cited by examiner

*Primary Examiner*—Jean F Duverne
(74) *Attorney, Agent, or Firm*—Cantor Colburn LLP

(57) ABSTRACT

Disclosed is a server control panel system including a server disposable in a rack, a rail flange extending from each of two opposite ends of a front face of the server, the flanges being configured associate the server with the rack, a panel opening defined by the front face, the panel opening disposed in proximity to one of the flanges, a server cavity in communication with the panel opening, a rail system disposed in the server cavity adjacent to a panel wall of the server, the panel opening being disposed in alignment with the rail system, a control panel including a face and a body, the control panel being translatably disposed with the rail system to move between a closed position and open position, the body being at least partially extended into an ambient environment of the server via the panel opening when in the open position.

7 Claims, 4 Drawing Sheets

SERVER CONTROL PANEL SYSTEM

BACKGROUND OF THE INVENTION

1. Field of the Invention

The disclosure generally relates to a server control panel system, and more particularly to a control panel system disposed in proximity to a rail flange of a server.

2. Description of Background

Current server control panels typically consume approximately 1¾" of front panel real estate disposed at a relative front of drawer servers. Generally, cooling airflow paths for the server's internal components are also disposed in this front panel real estate. With advances in the industry, component and processor heat generated in the servers is reaching temperatures that exceed current solutions for bringing more cooling airflow into the internal components of the server. Thus, a means for reducing the front panel real estate occupied by control panels would be desirable, in that it would allow for an increase in real estate used for airflow paths.

SUMMARY OF THE INVENTION

Disclosed is a server control panel system including a rack drawer server disposable in a server rack, the rack drawer server including a front face, a rack rail flange extending from each of two opposite ends of the front face, the rack rail flanges being configured associate the rack drawer server with the server rack, a control panel opening defined by the front face, the control panel opening disposed in proximity to one of the rack rail flanges, a server cavity in communication with the control panel opening, a panel rail system disposed in the server cavity adjacent to a control panel wall of the server, the control panel opening being disposed in alignment with the panel rail system, a control panel including a panel face and a panel body, the control panel being translatably disposed with the panel rail system to move between a closed position and open position, the panel body being at least partially extended into an ambient environment of the rack drawer server via the control panel opening when in the open position, and a flexible ribbon cable associating the control panel with computing elements of the rack drawer server.

BRIEF DESCRIPTION OF THE DRAWINGS

The foregoing and other features and advantages of the present invention should be more fully understood from the following detailed description of illustrative embodiments taken in conjunction with the accompanying Figures in which like elements are numbered alike in the several Figures.

DETAILED DESCRIPTION OF THE INVENTION

Figure 1:
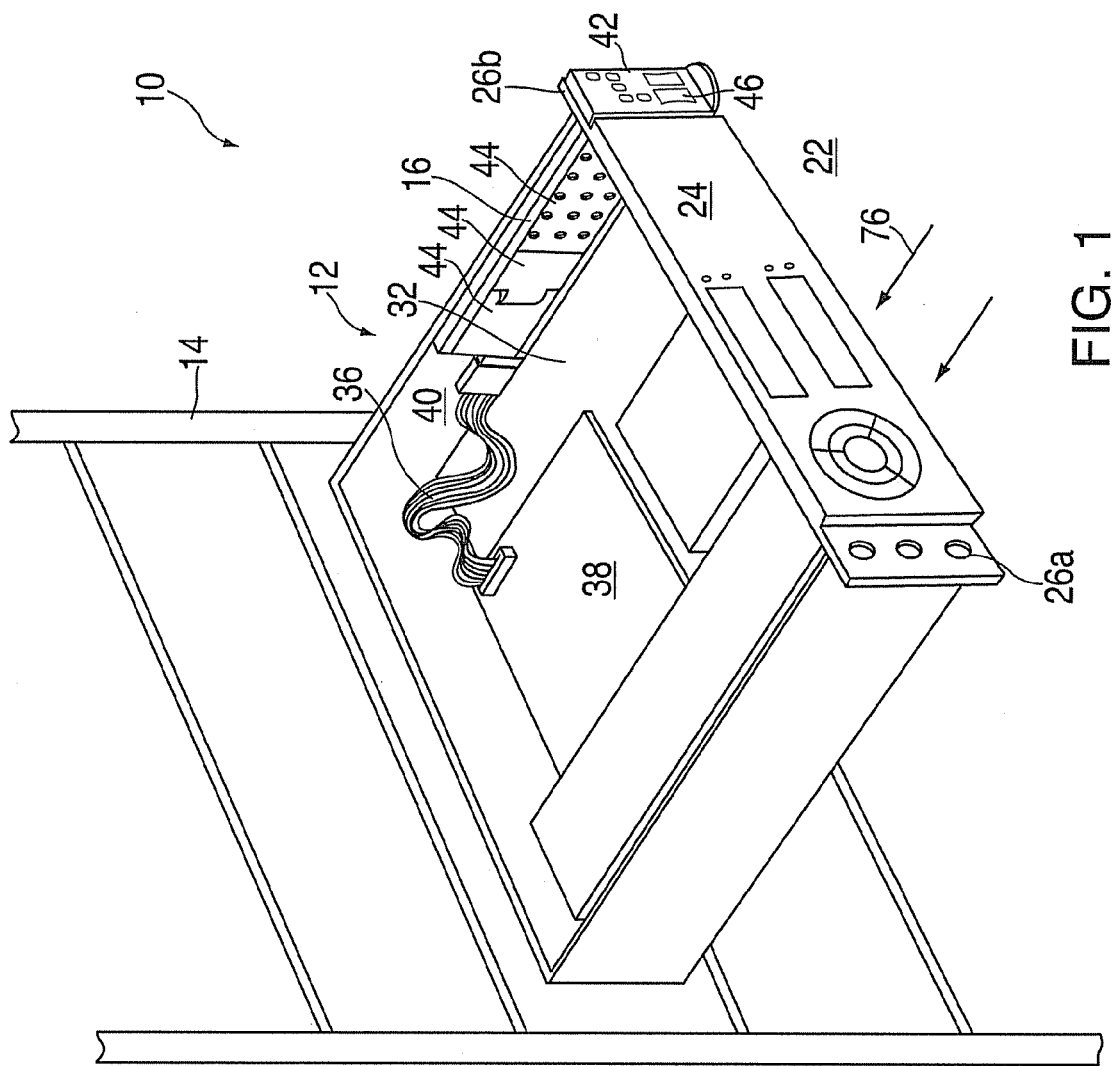
FIG. 1 is a side perspective view of an embodiment of a server control panel system with a control panel disposed in a closed position.
Figure 2:
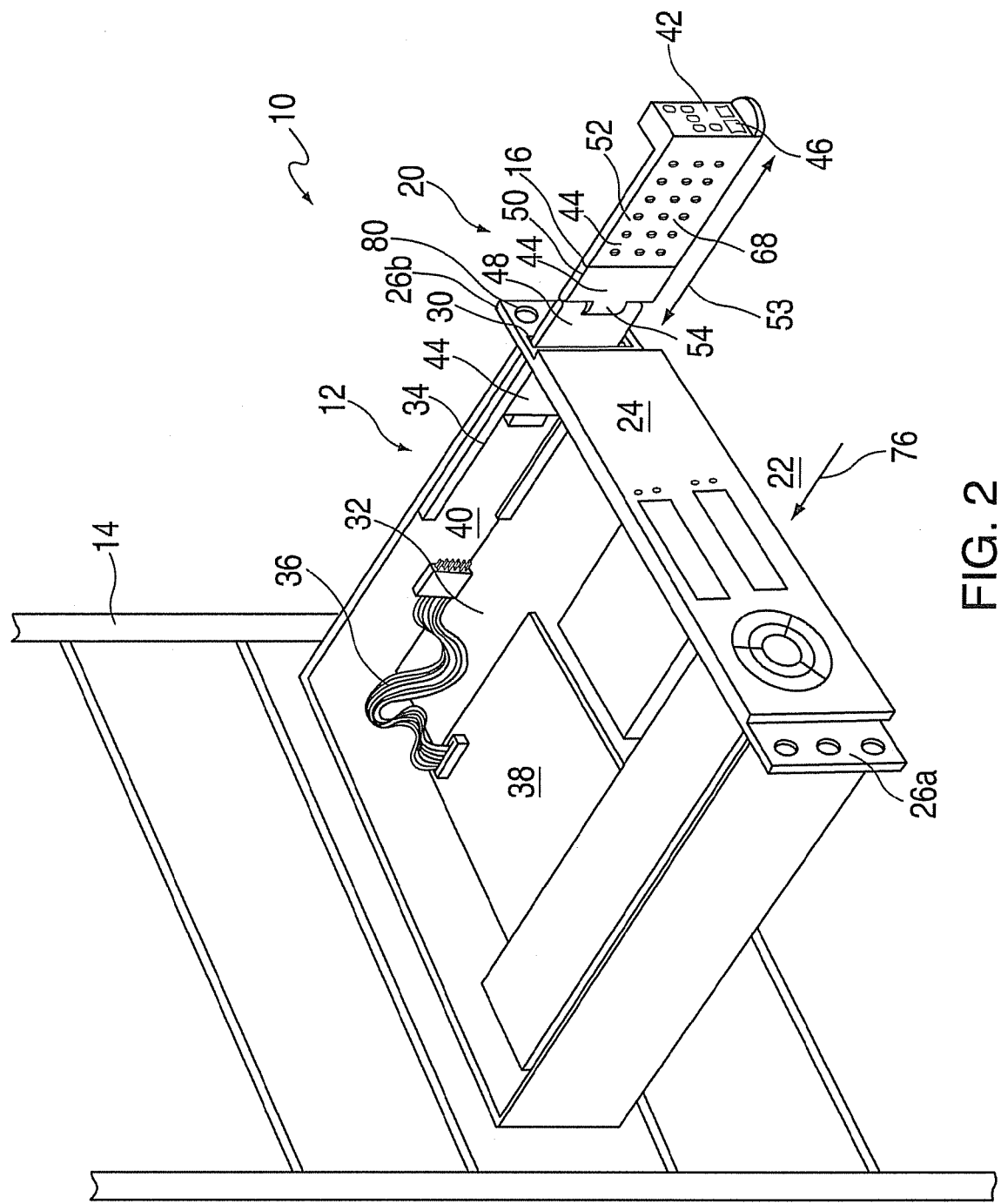
FIG. 2 is a side perspective view of the embodiment of a server control panel system of FIG. 1, with a control panel disposed in an open position.
Figure 3:
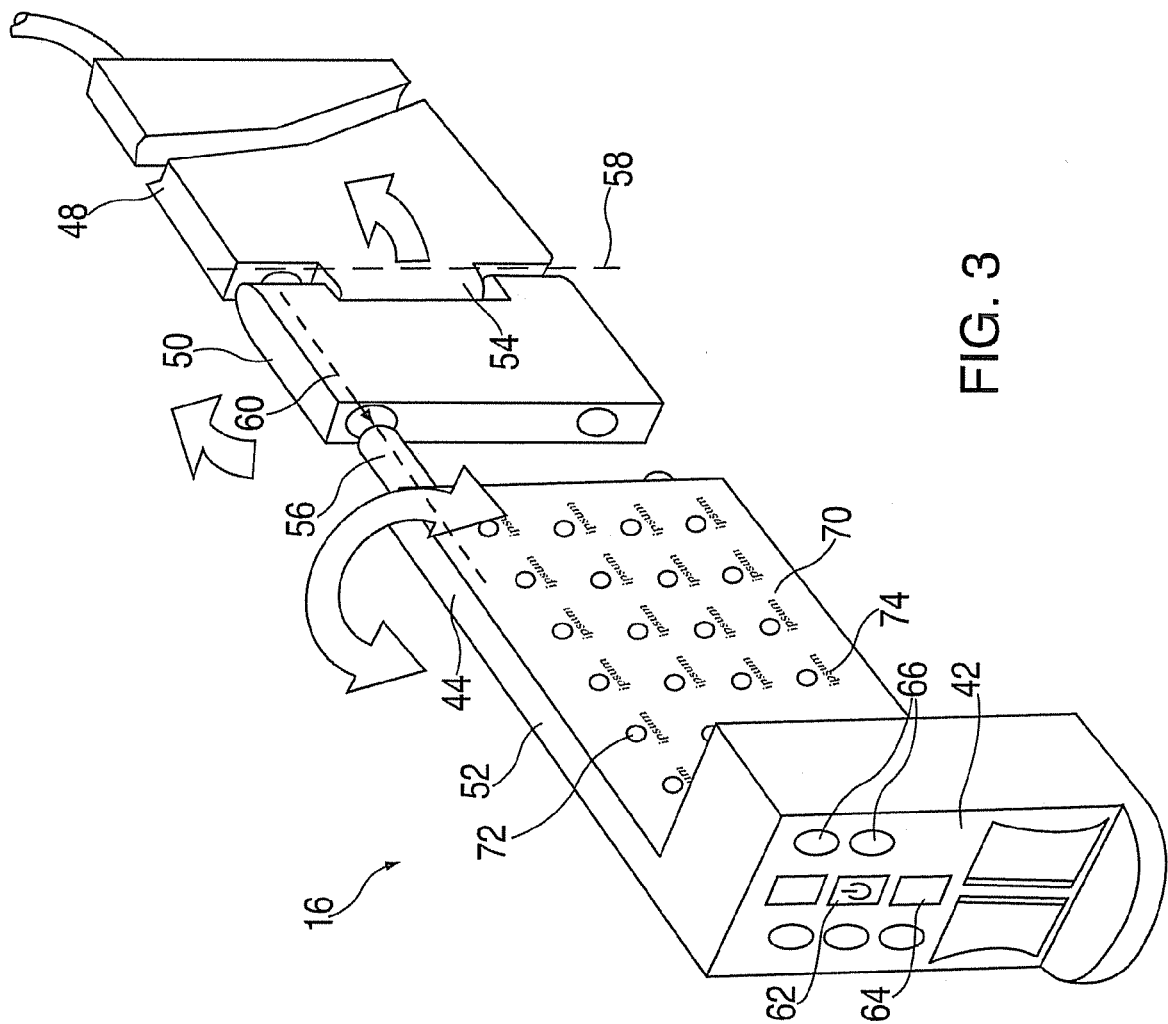
FIG. 3 is a side perspective the control panel of the embodiment of FIG. 1.

Referring to FIGS. 1-3, an exemplary embodiment of a server control panel system 10 for improving server airflow is illustrated. The system 10 includes a rack drawer server 12 disposable in server rack 14. The system also includes a control panel 16 that is translatable between a closed position 18 (FIG. 1) and an open position 20 (FIG. 2). As shown in FIG. 2, the control panel 16 is at least partially extended into an ambient environment 22 in front of the server 12 when it is in the open position 20. This exemplary embodiment of the system 10 will be discussed hereinbelow.

Referring to FIGS. 1 and 2, the server 12 includes a front face 24 that extends across a relative front of the server 12. Rack rail flanges 26a-b extend from each opposite end of this front face 24, and are configured to facilitate association between the server 12 and rack 14. Disposed in proximity to the flange 26b is a control panel opening 30 (see FIG. 2) that is defined by the front face 24. The opening 30 is in communication with a server cavity 32, which is defined by the server 12 as a whole (i.e. the walls that form a general server enclosure). A panel rail system 34, a flexible ribbon cable 36, and other various computing elements 38 are disposed within the server cavity 32. The rail system 34 is aligned with the control panel opening 30 and disposed adjacent to a control panel wall 40 of the server 12.

Disposed with the rail system 34 and extendable from the opening 30 is the control panel 16. As is shown in FIGS. 2 and 3 of this exemplary embodiment, the control panel 16 includes a panel face 42 and a panel body 44. As is shown in FIG. 1, the panel face 42 lies in (or near) contact with the front face 24 when the control panel 16 is in the closed position 18. As is shown in FIG. 2, the panel body 44 is exposed to the ambient environment 22 when the control panel 16 is in the open position 20. The control panel 16 may be translated between the closed position 18 and open position 20 via any means desirable, such as but not limited to an electric motor activated by a push button system, a squeeze release latch 46 (as shown in the embodiment of the Figures) actuated by a controlled spring system or manual force, or by use of software, (for example, via command from a computing resource). It should be appreciated that the ribbon cable 36 associates the control panel 16 with the computing element(s) 38, and extends with the panel 16 when it is moved from the closed position 18 to the open position 20.

Referring now to FIG. 3 in particular, the control panel 16 is not only translatable between the closed position 18 and open position 20, but also includes portions that move in three degrees of freedom when extended into the ambient environment 22. In this exemplary embodiment, the panel body 44 includes a first member 48, second member 50, and third member 52 associated in a same plane 53, with the third member 52 being of unitary construction with the panel face 42. The first member 48 slides or translates along the rail system 34, and is extendable almost completely into the ambient environment 22 when the control panel 16 is in the open position 20. The second member 50 is associated with the first member 48 via a hinge 54, and the third member 52 is associated with the second member 50 via a pivot point 56. In this embodiment, the hinge 54 allows the second member 50, third member 52, and panel face 42 to rotate about a hinged axis 58 created at the hinge 54. Similarly, the pivot point 56 allows the third member 52 and panel face 42 to rotate about a pivot point axis 60 created at the pivot point 56. Thus, via the hinge 54 and pivot point 56, the third member 52 and panel face 42 include three degrees of freedom when extended into the ambient environment 22. This type of movement further allows for convenient use of the control panel 16, as well as convenient access to the rail flange 26b located relatively behind it. This access to the flange 26b, further allows access to any means of associating the flange 26b to the rack 14, such as openings 80. These openings may be threaded to allow the flange 26b to be threadingly associated with the rack 14.

As is best shown in FIGS. 2 and 3, the control panel 16 (specifically the panel face 42 and third member 52) includes a plurality of server controls and light indicators. For example, the panel face 42 may include a power button 62, reset button 64, and fault/service LED indicators 66. In addition, the panel body 44 includes two control sides 68 and 70, each of which including fault/service LED indicators 72 and secondary controls 74.

It should be appreciated that placement of the control panel 16 in proximity to the rack flange 26b substantially removes the panel from a thermal airflow path 76 located in front of the front face 24. The dual control sides 68 and 70 of the panel body 44 also provide increased real estate for fault/service LED indicators 72 and secondary controls 74.

Figure 4:
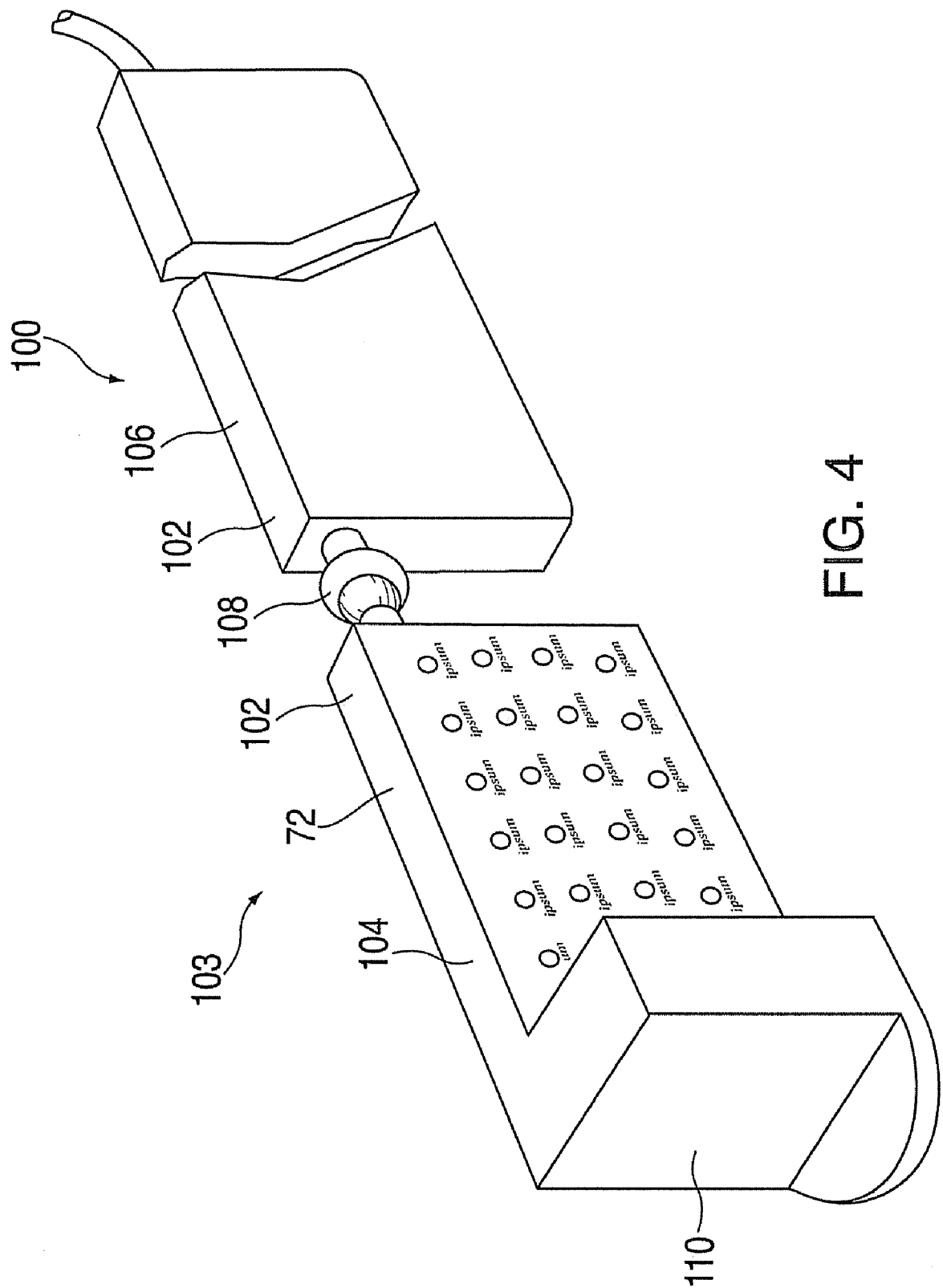
FIG. 4 is a side perspective of another embodiment of a control panel.

Referring to another exemplary embodiment 100 in FIG. 4, it should also be appreciated that a panel body 102 of a control panel 103 may include only a first member 104 and second member 106. The first member 102 and second member 104 in this embodiment are associated via a ball joint 108 to facilitate movement of the second member 106 and panel face 110 in three degrees of freedom.

It should be further appreciated that though the panel system 10 is shown in the Figures to include the drawer server 12 disposed in the server rack 14, the system 10 may also be employed with a tower configuration, wherein the control panel 16 is horizontally oriented in near adjacency to a relative top or bottom wall of a tower server. A control panel 16 used with a tower configuration may also move in three degrees of freedom, as discussed above and shown in the Figures.

While the invention has been described with reference to an exemplary embodiment, it should be understood by those skilled in the art that various changes may be made and equivalents may be substituted for elements thereof without departing from the scope of the invention. In addition, many modifications may be made to adapt a particular situation or substance to the teachings of the invention without departing from the scope thereof. Therefore, it is important that the invention not be limited to the particular embodiment disclosed as the best mode contemplated for carrying out this invention, but that the invention will include all embodiments falling within the scope of the apportioned claims. Moreover, unless specifically stated any use of the terms first, second, etc. do not denote any order or importance, but rather the terms first, second, etc. are used to distinguish one element from another.

What is claimed is:

1. A server control panel system comprising:
   a rack drawer server disposable in a server rack, said rack drawer server including a front face;
   a rack rail flange extending from each of two opposite ends of said front face, said rack rail flanges being configured associate said rack drawer server with said server rack;
   a control panel opening defined by said front face, said control panel opening disposed in proximity to one of said rack rail flanges;
   a server cavity disposed at an interior of and defined by said rack drawer server, said server cavity being in communication with said control panel opening;
   a panel rail system disposed within said server cavity in contact with an interior wall of said rack drawer server, said control panel opening being disposed in alignment with said panel rail system;
   a control panel including a panel face and a panel body, said control panel being translatably disposed with said panel rail system to move between a closed position and open position through said control panel opening and independently of movement of a remainder of said rack drawer server, said panel body being at least partially contained within said server cavity of said rack drawer server when in said closed position, and said panel body being at least partially extended into an ambient environment beyond an extent of said front face of said rack drawer server, said panel body extending via said control panel opening when in said open position; and
   a flexible ribbon cable associating said control panel with computing elements of said rack drawer server.

2. The system of claim 1, wherein at least a portion said control panel includes three degrees of freedom when extended into said ambient environment.

3. The system of claim 2, wherein said panel body includes a first member, a second member, and a third member associated in a same plane, said third member being of unitary construction with said panel face.

4. The system of claim 3, wherein said second member is associated with said first member via a hinge that allows rotation of said second member, said third member, and said panel face about a hinged axis at said hinge, and said third member is associated with said second member via a pivot point that allows pivoting of said third and said panel face member about a pivot point axis at said pivot point.

5. The system of claim 2, wherein said panel body includes a translatable first member and a translatable second member associated in a same plane, said translatable first member and said translatable second member being associated via a ball joint.

6. The system of claim 1, wherein panel body includes two control sides, each of said control sides including light path LED indicators and secondary controls.

7. The system of claim 1, wherein said panel face includes a squeeze release latch for activating translation of said control panel into said open position, and wherein said panel face includes a power button, reset button, and fault indicators.

* * * * *